(12) United States Patent
Nakajima

(10) Patent No.: US 6,290,802 B1
(45) Date of Patent: Sep. 18, 2001

(54) METHOD OF MANUFACTURING LAMINATE AND GROMMET USED FOR THE METHOD

(75) Inventor: Shigeki Nakajima, Toyama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/376,363

(22) Filed: Aug. 18, 1999

(30) Foreign Application Priority Data

Aug. 18, 1998 (JP) .................................................. 10-231936

(51) Int. Cl.⁷ ...................................................... B32B 31/00
(52) U.S. Cl. ................................ 156/290; 156/292; 16/2.1
(58) Field of Search .................................. 156/290, 292, 156/253; 16/2.1

(56) References Cited

U.S. PATENT DOCUMENTS

| 4,229,473 | * | 10/1980 | Elber | ................................ | 156/330 X |
| 4,274,901 | * | 6/1981 | Elber | ................................ | 156/290 X |

FOREIGN PATENT DOCUMENTS

| 2-10888 | * | 1/1990 | (JP) . |
| 2-206197 | * | 8/1990 | (JP) . |
| 4-96392 | * | 3/1992 | (JP) . |
| 4-125989 |  | 4/1992 | (JP) . |
| 4-152596 | * | 5/1992 | (JP) . |
| 4-152597 | * | 5/1992 | (JP) . |
| 6-177539 | * | 6/1994 | (JP) . |
| 6-244555 |  | 9/1994 | (JP) . |
| 7-86751 |  | 3/1995 | (JP) . |
| 9-293965 |  | 11/1997 | (JP) . |

\* cited by examiner

*Primary Examiner*—Jeff H. Aftergut
(74) *Attorney, Agent, or Firm*—Sughrue, Mion, Zinn, Macpeak & Seas, PLLC

(57) ABSTRACT

A method of manufacturing a laminate obtained by laminating a plurality of plate members such as wiring plates (1) and prepregs (2), comprising: a step of temporarily fixing the plate members by a grommet (3) having plural resin filling holes (9) formed on the side surface thereof to obtain a temporarily-fixed laminate (5); and a step of heating and pressurizing the temporarily-fixed laminate (5) to fill the resin melted from the prepregs (2) of the temporarily-fixed laminate (5) through the resin filling holes (9) of the grommet (3) into the throughhole (6) of the grommet (3).

7 Claims, 3 Drawing Sheets

PRIOR ART

US 6,290,802 B1

METHOD OF MANUFACTURING LAMINATE AND GROMMET USED FOR THE METHOD

BACKGROUND OF THE INVENTION

1. Field of the Invention

The present invention relates to a method of manufacturing a laminate such as a multilayer printed wiring board or the like, and the improved structure of a grommet used for this method.

2. Description of the Related Art

FIG. 5 is a perspective view showing a conventional grommet, and FIG. 6 is a cross-sectional view showing a conventional multilayer printed wiring board using the grommet shown in FIG. 5.

As disclosed in Japanese Patent Application Laid-open No. Hei-6-244555 titled as "METHOD OF MANUFACTURING MULTILAYER LAMINATE PLATE", the conventional multilayer printed wring board is obtained by laminating an inner layer wiring plate 1 having a wiring circuit formed on the surface thereof and a prepreg 2 to form a laminate 5 and then subjecting the laminate to a forming process under heat and pressure to settle the laminate.

In order to avoid positional displacement or missregistration during the heating and pressuring process, the inner wiring plate 1 and the prepreg 2 are temporarily fixed by a grommet 3 which is provided at the peripheral portion of the inner wiring plate 1 and the prepreg 2 so as to penetrate through the inner layer wiring plate 1 and the prepreg 2.

FIG. 5 is a perspective view showing the outlook of the grommet 3 used for the temporary fixing. As shown in FIG. 5, the grommet 3 has a flange 4 at the tip thereof and a number of cut-out grooves (not shown) in the longitudinal direction at the upper and lower end portions. A pressure is applied to the laminate 5 from the upper and lower sides by the flange 4 to fix the laminate 5, whereby the inner layer wiring plate 1 and the prepreg 2 are temporarily settled and the inner layer wiring layer 1 and the prepreg 2 are positioned.

Subsequently, resin such as epoxy resin or the like which is hardened at high speed is filled into a through hole 6 of the grommet by an injector or the like, and the resin thus injected is hardened to form a resin layer 7 in the through hole. Thereafter, metal foil 8 such as copper foil or the like is laminated on the laminate, and the laminate with the metal foil is set in a press forming apparatus (laminating press) while it is sandwiched between forming plates to be subjected to the heat and pressure forming process.

By performing the above heat-and-pressure forming process, the prepreg resin is completely hardened to obtain a multilayer printed wiring board having the inner layer wiring plate 1.

Japanese Patent Application Laid-open No. Hei-9-293965 titled as "MULTILAYER WIRING BOARD MANUFACTURING METHOD" describes a technique of filling solder in place of the resin layer to be formed in the through hole of the grommet pin disclosed in Japanese Laid-open Patent Application No. Hei-6-244555.

Further, Japanese Patent Application Laid-open No. Hei-2-10888 titled as "MULTILAYER WIRING BOARD MANUFACTURING METHOD" describes a technique of temporarily fixing a laminate comprising plural inner layer wiring plates and plural prepregs by a grommet pin which is formed so as to be hollow at a crimped or grooved portion and so as to be closed with metal or the like at portions other than the crimped or grooved portion.

However, when the conventional grommet is used and only resin in the prepregs which are overlaid on the grommet from the upper and lower sides is filled into the grommet, the resin cannot be completely filled into the grommet, and thus a work of filling the resin into the grommet hole in advance is needed. Further, a step of hardening the filled resin is required, so that the total number of steps is increased.

When the thickness of the laminate to be manufactured is equal to 1.6 mm or more, it is difficult to completely fill the resin into the grommet. Therefore, insufficient filling occurs and a filling-insufficient portion 11 occurs as shown in FIG. 6. Accordingly, when the heat-and-pressure forming process is carried out, the sufficient strength cannot be obtained at the grommet portion, and thus the respective inner layer members are positionally displaced or missregistered from one another by 150 $\mu$m or more.

The reason for this is as follows. The conventional grommet is designed in a cylindrical shape, and when a prepreg to be mounted after the temporary fixing is thin, the resin cannot be completely filled into the grommet hole. Therefore, cavities occur in the grommet hole and thus the sufficient strength cannot be obtained in the heat-and-pressure forming process, so that the work of filling the resin into the grommet hole is needed.

Further, when the resin is injected into the grommet by an injector or the like as in the case of the conventional technique, the resin may be swollen in case that the excess amount of the resin is injected, so that the surface thereof is not flat. Accordingly, uniform pressure is not applied in the heat-and-pressure forming process and thus unevenness occurs in the final product. Therefore, in the prior art, grommet portions which are provided at four corners on the periphery of the laminate having a lamination blank size (the size at the lamination time) are cut off together with the peripheral portion after the heat-and-pressure forming process, thereby obtaining the design blank having a design blank size (product size) having no unevenness. Therefore, although any grommet does not remain in the products, it is needed to increase the lamination blank size to be larger than the design blank size by about 10%, so that material may be wasted or much labor is imposed on the cut-off work of the peripheral portion.

SUMMARY OF THE INVENTION

An object of the present invention is to delete a work of filling resin into a grommet hole and a work of hardening the filled resin, thereby reducing the number of steps.

Another object of the present invention is to enable perfect filling of resin into a grommet hole, thereby achieving the strength of a grommet portion and also preventing positional displacement or missregistration of inner layer members when a heat-and-pressure forming process is carried out.

Further object of the present invention is to flatten the surface of the grommet portion of a laminate plate after the forming process.

In order to attain the above objects, according to an aspect of the present invention, a method of manufacturing a laminate obtained by laminating a plurality of plate members is characterized by comprising: a step of temporarily fixing the plurality of plate members by a grommet having plural resin filling holes formed on the side surface thereof to obtain a temporarily-fixed laminate; and a step of heating and pressurizing the temporarily-fixed laminate to fill resin melted from the temporarily-fixed laminate through the resin filling holes of the grommet into the grommet.

Further, a method of manufacturing a laminate obtained by laminating wiring plates and prepregs is characterized by comprising: a step of temporarily fixing the wiring plates and the prepregs by a grommet having plural resin filling holes formed on the side surface thereof to obtain a temporarily-fixed laminate; and a step of heating and pressurizing the temporarily-fixed laminate to fill the resin melted from the temporarily-fixed laminate through the resin filling holes of the grommet into the grommet.

In the above laminate manufacturing method, the resin may be melted from the prepregs.

According to another aspect of the present invention, there is provided a grommet having plural resin filling holes formed on the tube-shaped side surface thereof, and each of the resin filling holes may be designed in a circular shape, in a rectangular shape or in a reticular shape.

The size (A) of an opening portion of each of the resin filling holes may be set according to the following inequality: $0.005 \text{ mm}^2 \leq (A) \leq 1.0 \text{ mm}^2$.

The total area of opening portions of the resin filling holes of the grommet may be set to be equal to or greater than 20% of the total area of the side surface of the grommet, while the total area of the opening portions may be set to be equal to or less than 40% of the total area of the side surface of the grommet.

The periphery of a flange portion provided at the end of the grommet may be designed in a tooth shape.

The length (B) of the tooth shape may be set as follows: $0.03 \text{ mm} \leq (B) \leq 0.07 \text{ mm}$.

The pitch (C) of the tooth shape may be set as follows: $0.05 \text{ mm} \leq (C) \leq 0.10 \text{ mm}$.

According to the present invention, in a method of manufacturing a laminate plate such as a multilayer printed wiring board or the like with use of a grommet, when an inner core member and a prepreg are piled up and a grommet is crimped for fixing them to each other, a grommet having plural resin filling holes formed on the side surface thereof is used, whereby the resin filling into the grommet is enabled simultaneously in the heat-and-pressure forming process and the resin can be perfectly filled into the grommet. In addition, the grommet portion after the lamination is finished to be flat irrespective of the amount of the prepreg superimposed in the forming process.

Further, even when the thickness of the laminate to be formed is large, the resin filling can be perfectly performed, so that when the heat-and-pressure forming process is carried out, the sufficient strength of the grommet portion can be obtained and the positional displacement or missregistration of the inner core members can be prevented.

Still further, according to the present invention, a suitable amount of resin is filled into the grommet through the resin filling holes on the side surface of the grommet, so that the grommet portion can be flatly finished without any unevenness in the heat-and-pressure forming process. Therefore, unlike the prior art, it is unnecessary to cut off the grommet portion together with the peripheral portion of the laminate plate, and the products can be completed with leaving the grommet portions in the products.

Accordingly, the present invention has the following effects:

[1] The grommet portions is flat after the lamination. Therefore, the grommets can be disposed at four corners in the design blank having the design blank size (product size) and thus it is unnecessary to cut off the peripheral portion of the blank. Therefore, the material cost can be reduced by about 10% as compared with the prior art.

[2] The lamination blank size (lamination size) which is conformed with the design blank size (product size) can be used. Therefore, it is unnecessary to use the work of cutting off the peripheral portion which has been carried out in the prior art. In addition, the resin filling into the grommets can be performed irrespective of the resin amount of the prepreg to be superimposed after the grommet step. Therefore, the step of filling the resin into the grommets by an injector or the like when the inner layer core members are temporarily fixed, and the step of hardening the filled resin are not needed, so that the number of steps can be reduced.

DETAILED DESCRIPTION OF THE PREFERRED EMBODIMENTS

Preferred embodiments according to the present invention will be described with reference to the accompanying drawings.

First Embodiment

Figure 1:
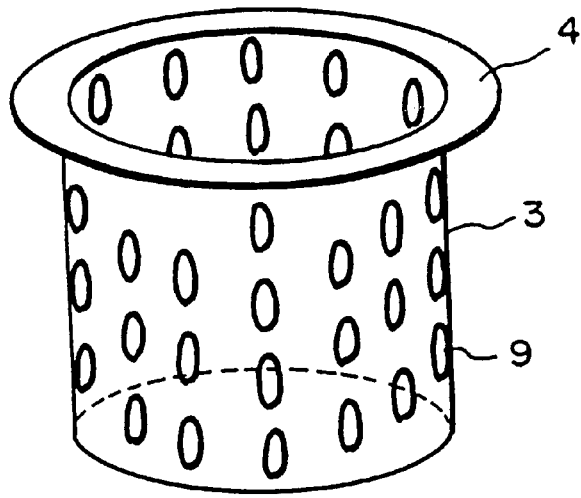
FIG. 1 is a perspective view showing a grommet according to a first embodiment of the present invention.
Figure 2:
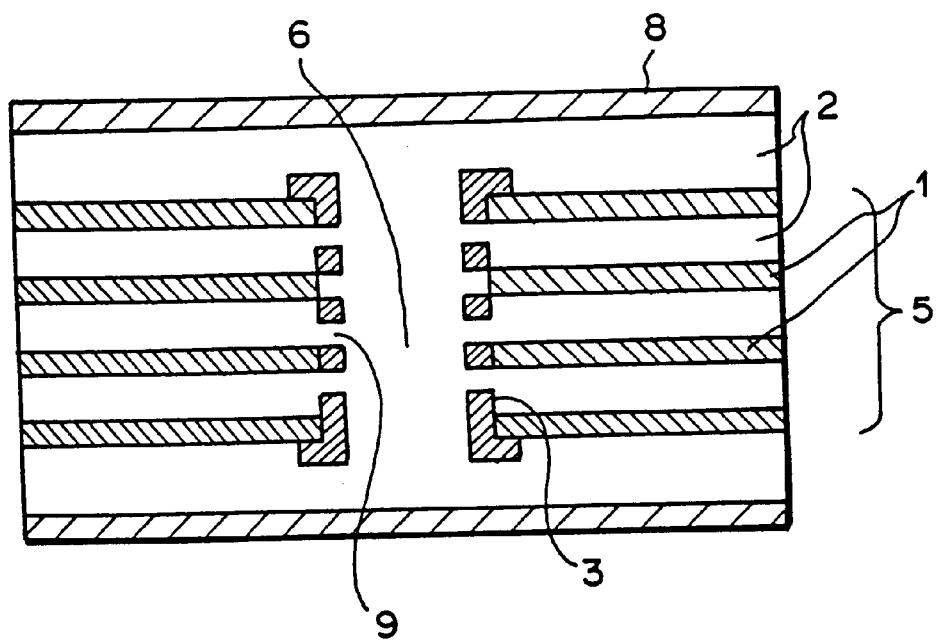
FIG. 2 is a cross-sectional view showing a multilayer printed wiring board according to the first embodiment of the present invention.

FIG. 1 is a perspective view showing the construction a grommet according to a first embodiment of the present invention, and FIG. 2 is a cross-sectional view showing a multilayer printed wiring board according to the first embodiment.

In a method of manufacturing a multilayer printed wiring board by a grommet lamination, a substrate of glass epoxy resin, glass polyimide resin or the like which is coated with metal foil such as copper foil or the like is subjected to an etching treatment to form a wiring circuit on the surface of the substrate, and then plural wiring substrates (wiring plates) thus formed are superimposed with one or plural prepregs positioned therebetween.

The prepreg is formed by impregnating thermosetting resin such as epoxy resin, polyimide resin or the like into a substrate of glass cloth, non-woven or the like and semi-hardening the thermosetting resin.

In order to avoid the positional displacement or positioning error or missregistration between each inner layer wiring plate 1 having the wiring circuit formed on the surface of the laminate substrate and each prepreg 2 in the heat-and-pressure forming process, a positioning hole is beforehand formed at the position of the inner layer wiring plate 1 and the prepreg 2 which corresponds to the fixing position by the grommet thereby fixing the inner layer wiring plate 1 and the prepreg 2 thereon by the grommet 3 and preventing the positional displacement or missregistration.

As shown in FIG. 2, the inner layer wiring plates 1 and the prepregs 2 are combined so as to have a desired construction, and a grommet 3 having a flange 4 at the tip thereof and plural resin filling holes 9 formed on the side surface thereof as shown in FIG. 1 is inserted through the positioning hole penetrating through the inner layer wiring layer 1 and the prepreg 2. The grommet 3 is pressed from the upper and lower sides on the flange 4 and the other end to fix the inner layer wiring plates 1 and the prepregs 2 to form a temporarily-fixed laminate 5, whereby the inner layer wiring plates 1 and the prepregs 2 are temporarily fixed to position the inner layer wiring plates 1 and the prepregs 2.

The outer shape of the grommet 3 is a barrel shape or tube shape such as a cylindrical shape, a pillar shape or the like, that is, the side surface of the grommet 3 is tube-shaped. The resin filling holes 9 are each designed to have the following opening portion size (A): $0.005 \text{ mm}^2 \leq (A) \leq 1.0 \text{ mm}^2$, so that the resin filling efficiency can be enhanced with keeping the strength of the grommet. The shape of the resin filling holes is set to be circular, rectangular, reticular or the like.

The optimum total area of all the holes per grommet is set in the range within 20% to 40% of the total area of the side surface, whereby the sufficient strength of the laminate can be obtained after the grommet is pressed, and also the filling can be surely performed.

Further, metal such as brass, copper or the like and thermosetting resin may be used as the material of the grommet.

Subsequently, a prepreg 2 and metal foil 8 such as copper foil or the like are superimposed on each of the upper and lower surfaces of the laminate 5 formed by the above method, and the result is set in a press forming apparatus or laminating press while sandwiched by forming plates and subjected to the heat-and-pressure forming process.

By the heat-and-pressure forming process, the resin melted from the prepregs 2 is perfectly filled through the holes 9 formed on the side surface of the grommet 3 into the through hole 6 of the grommet, and hardened, thereby obtaining a multilayer printed wiring board having the inner layer wiring plates 1.

Second Embodiment

Figure 3:
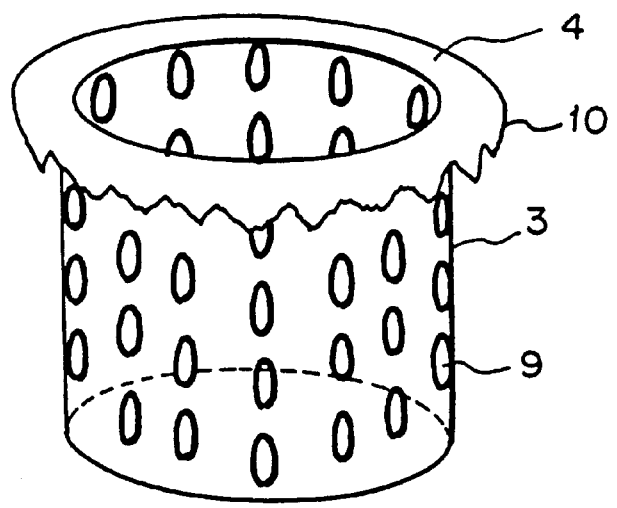
FIG. 3 is a perspective view showing a grommet according to a second embodiment of the present invention.
Figure 4:
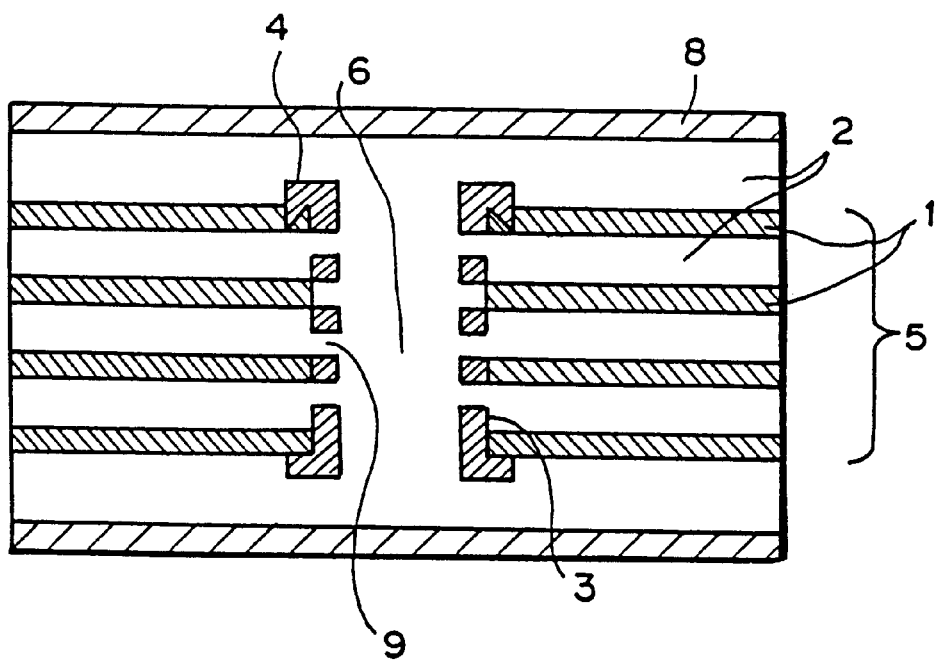
FIG. 4 is a cross-sectional view showing a multilayer printed wiring board according to the second embodiment of the present invention.
Figure 5:
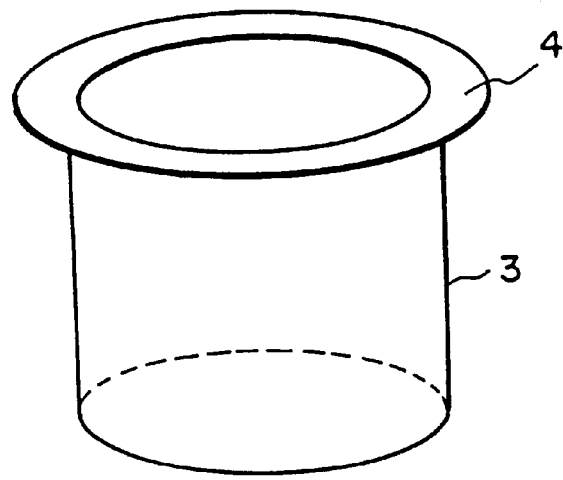
FIG. 5 is a perspective view showing a conventional grommet.
Figure 6:
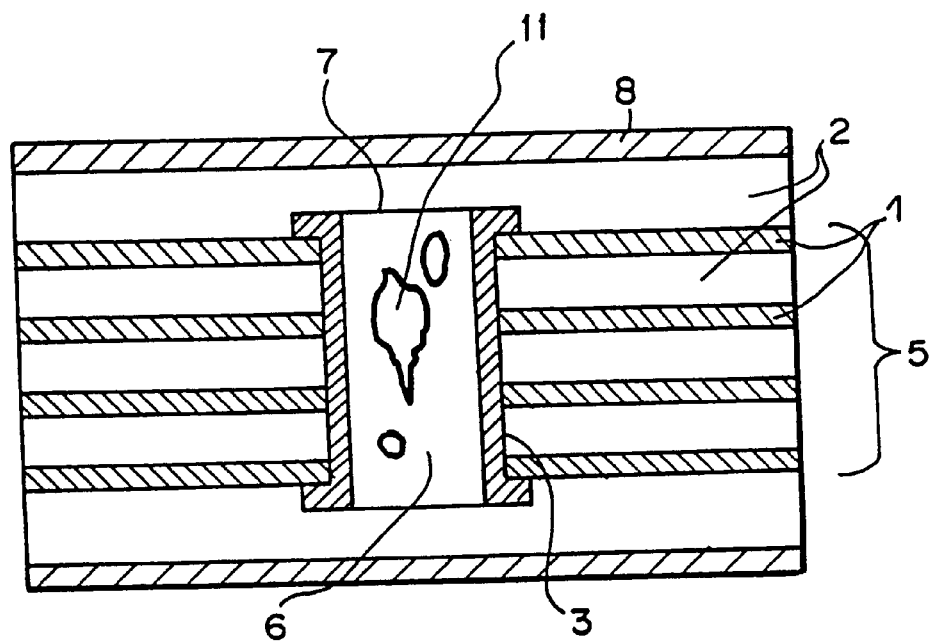
FIG. 6 is a cross-sectional view showing a conventional multilayer printed wiring board.

FIG. 3 is a perspective view showing a grommet according to a second embodiment of the present invention. FIG. 4 is a cross-sectional view showing a multilayered print wiring plate of the second embodiment.

The second embodiment is the same as the first embodiment in that in order to avoid the positional displacement or positioning error or missregistration between each inner layer wiring plate 1 having a wiring circuit formed on the surface of the laminate substrate and each prepreg in the heat-and-pressure forming process, however, differs from the first embodiment in that the structure of the flange portion 4 of the grommet 3 is designed in a tooth shape as shown in FIG. 3.

As shown in FIGS. 3 and 4, the grommet 3 of the second embodiment has tooth-shaped portions 10 on the periphery of the tip portion of the flange 4, and these tooth-shaped portions 10 are jammed into the inner layer member when the pressure is applied to the flange portion 4, thereby firmly fixing the inner layer members and the prepregs, whereby the inner wiring plates 1 and the prepregs 2 are perfectly temporarily fixed and positioned.

The shape of the resin filling holes 9 on the side surface of the grommet 3 is the same as the first embodiment, and the length (B) of each tooth-shaped portion of the flange portion 4 is set as follows: $0.03 \text{ mm} \leq (B) \leq 0.07 \text{ mm}$, whereby the substrate can be firmly fixed with the optimum jamming amount without breaking the substrate.

Further, the pitch (C) of the tooth-shaped portions 10 of the flange portion 4 is set in the following optimum range: $0.05 \text{ mm} \leq (C) \leq 0.10 \text{ mm}$, and the sufficient strength of the laminate after the temporary fixing can be achieved. Metal such as brass, copper or the like may be used as the material of the grommet 3.

Subsequently, in the second embodiment, as in the case of the first embodiment, a prepreg 2 and metal foil 8 such as copper foil or the like are superimposed on the laminate 5 thus formed, and then the result is sandwiched by the forming plates, set in the press forming apparatus or laminating press and then subjected to the heat-and-pressure forming process. In this process, the resin is filled through the resin filling holes 9 into the through hole 6 of the grommet 3 and then perfectly hardened, thereby obtaining a multilayer printed wiring board having the inner wiring plates 1.

According to the second embodiment, the tooth-shaped portions 10 provided at the tip of the flange portion 4 are jammed into the inner layer member in the temporary fixing process to firmly fix the inner layer members, so that the positional displacement or positioning error or missregistration of the inner layer members can be reduced to be less than 50 $\mu$m.

Other embodiments

The resin to be filled into the grommet is not limited to the resin melted from the prepreg, and resin melted from a wiring plate or another laminate plate may be filled into the grommet.

Further, the present invention is not limited to the method of manufacturing a laminate based on the wiring plate and the prepreg, but it may be widely applied to a method of manufacturing a laminate with use of any member made of material from which resin is eluted by heat and/or pressure.

As described above, according to the present invention, in the method of manufacturing a laminate plate such as a multilayer printed wiring board or the like with use of a grommet, when the inner layer core member and the prepreg are superimposed and the grommet is crimped for fixing the inner layer core member and the prepreg, the grommet having the resin filling holes formed on the side surface thereof is used, whereby the resin filling into the grommet also can be performed in the heat-and-pressure forming process. The resin can be perfectly filled into the grommet and the grommet portion can be flatly finished in the lamination irrespective of the amount of the prepreg superimposed on the temporarily-fixed laminate in the forming process.

Further, even when the thickness of the laminate to be formed is large, the resin filling can be perfectly performed. Therefore, when the heat-and-pressure forming process is carried out, the sufficient strength of the grommet portion can be obtained, and the positional displacement or positioning error or missregistration of the inner layer members can be avoided.

Still further, according to the present invention, a suitable amount of resin is filled into the grommet through the resin filling holes on the side surface of the grommet, so that the grommet portion can be flatly finished without any unevenness in the heat-and-pressure forming process. Therefore, unlike the prior art, it is unnecessary to cut off the grommet portion together with the peripheral portion of the laminate plate, and the products can be completed with leaving the grommet portions in the products.

Still further, according to the present invention, there can be achieved the following effects.

[1] The grommet portions is flat after the lamination. Therefore, the grommets can be disposed at four corners in the design blank having the design blank size (product size) and thus it is unnecessary to cut off the peripheral portion of the blank. Therefore, the material cost can be reduced by about 10% as compared with the prior art.

[2] The lamination blank size (lamination size) which is conformed with the design blank size (product size) can be used. Therefore, it is unnecessary to use the work of cutting off the peripheral portion which has been carried out in the prior art. In addition, the resin filling into the grommets can be performed irrespective of the resin amount of the prepreg to be superimposed after the grommet step. Therefore, the step of filling the resin into the grommets by an injector or the like when the inner layer core members are temporarily fixed, and the step of hardening the filled resin are not needed, so that the number of steps can be reduced.

What is claimed is:

1. A method of manufacturing a laminate, comprising:
   a step of providing a grommet having a plurality of resin filling holes formed on a side surface thereof;
   a step of temporarily fixing a plurality of plate members by the grommet to obtain a temporarily-fixed laminate including resin therein; and
   a step of heating and pressurizing the temporarily-fixed laminate such that the resin is melted and flows through the resin filling holes of the grommet and into the grommet.

2. The laminate manufacturing method as claimed in claim 1, wherein size (A) of an opening portion of each of said resin filling holes is set as follows: $0.005 \text{ mm}^2 \leq (A) \leq 1.0 \text{ mm}^2$.

3. The laminate manufacturing method as claimed in claim 1, wherein total area of an opening portion of said resin filling holes is set in a range from 20% to 40% of total area of the side surface.

4. A method of manufacturing a laminate, comprising:
   a step of providing a grommet having a plurality of resin filling holes formed on a side surface thereof;
   a step of temporarily fixing wiring plates and prepregs by the grommet to obtain a temporarily-fixed laminate including resin therein; and
   a step of heating and pressurizing the temporarily-fixed laminate such that the resin is melted and flows through the resin filling holes of the grommet and into the grommet.

5. The laminate manufacturing method as claimed in claim 2, wherein the resin is melted from the prepregs.

6. The laminate manufacturing method as claimed in claim 2, wherein size (A) of an opening portion of each of said resin filling holes is set as follows: $0.005 \text{ mm}^2 \leq (A) \leq 1.0 \text{ mm}^2$.

7. The laminate manufacturing method as claimed in claim 2, wherein total area of an opening portion of said resin filling holes is set in a range from 20% to 40% of total area of the side surface.

* * * * *